(12) United States Patent
Hsu et al.

(10) Patent No.: US 10,319,709 B2
(45) Date of Patent: Jun. 11, 2019

(54) INTEGRATED CIRCUITS WITH STANDARD CELL

(71) Applicant: UNITED MICROELECTRONICS CORP., Hsin-Chu (TW)

(72) Inventors: Chen-Hsien Hsu, Hsinchu County (TW); Chien-Fu Chen, Miaoli County (TW); Cheng-Yang Tsai, Kaohsiung (TW); Wei-Jen Wang, Tainan (TW); Chao-Wei Lin, New Taipei (TW); Zhi-Hong Huang, Tainan (TW); Cheng-Tsung Ku, Taichung (TW); Chin-Sheng Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/987,911

(22) Filed: May 24, 2018

(65) Prior Publication Data

US 2019/0088639 A1    Mar. 21, 2019

Related U.S. Application Data

(62) Division of application No. 15/785,447, filed on Oct. 17, 2017.

(30) Foreign Application Priority Data

Sep. 15, 2017    (CN) .......................... 2017 1 0830604

(51) Int. Cl.
*H01L 27/02*    (2006.01)
*H01L 27/092*    (2006.01)
(Continued)

(52) U.S. Cl.
CPC ........ *H01L 27/0207* (2013.01); *H01L 23/528* (2013.01); *H01L 23/5226* (2013.01); (Continued)

(58) Field of Classification Search
CPC ............... H01L 27/0207; H01L 23/528; H01L 27/0924; H01L 23/5226; H01L 29/167; H03K 19/0948; H03K 19/20
See application file for complete search history.

(56) References Cited

U.S. PATENT DOCUMENTS 5,969,420 A * 10/1999 Kuge .................. H01L 23/5286
257/204
7,932,566 B2    4/2011 Hou
(Continued)

*Primary Examiner* — Syed I Gheyas
(74) *Attorney, Agent, or Firm* — Winston Hsu

(57) ABSTRACT

The present invention provides an integrated circuit with a standard cell of an inverter standard cell. The integrated circuit includes: a first metal line and a second metal line stretching along a first direction; a first dummy gate and a second dummy gate stretching along a second direction; Plural fin structures stretching along the first direction; A gate structure disposed on the fin structures and stretching along the second direction; Two long contact plugs disposed at one side of the gate structure; two short contact plugs disposed at the other side of the gate structure; a gate contact plug disposed on the gate structure; Plural via plugs disposed on the long contact plugs, the short contact plugs and the gate contact plugs; A metal layer includes the first metal line, the second metal line, a third metal line and a fourth metal line.

10 Claims, 4 Drawing Sheets

(51) Int. Cl.
*H01L 23/522* (2006.01)
*H01L 23/528* (2006.01)
*H03K 19/0948* (2006.01)
H03K 19/20 (2006.01)
H01L 29/167 (2006.01)

(52) U.S. Cl.
CPC ..... *H01L 27/0924* (2013.01); *H03K 19/0948* (2013.01); *H01L 29/167* (2013.01); *H03K 19/20* (2013.01)

(56) References Cited

U.S. PATENT DOCUMENTS

| | | |
|---|---|---|
| 8,159,013 B2 | 4/2012 | Nishimura |
| 8,504,972 B2 | 8/2013 | Hou |
| 8,739,104 B1 | 5/2014 | Penzes |
| 8,756,550 B2 | 6/2014 | Blatchford |
| 8,943,455 B2 | 1/2015 | Chen |
| 9,123,565 B2 | 9/2015 | Lu |
| 9,317,646 B2 | 4/2016 | Lu |
| 9,905,561 B2 | 2/2018 | Kim |
| 2007/0228419 A1* | 10/2007 | Komaki ............ H01L 27/0207 257/202 |
| 2011/0177658 A1* | 7/2011 | Law ................ H01L 27/0207 438/129 |
| 2012/0286331 A1 | 11/2012 | Aton |
| 2016/0049395 A1* | 2/2016 | Okagaki ........... G06F 17/5077 257/401 |
| 2016/0086863 A1* | 3/2016 | Won ................. H01L 22/14 438/17 |

\* cited by examiner

INTEGRATED CIRCUITS WITH STANDARD CELL

CROSS REFERENCE TO RELATED APPLICATIONS

This application is a divisional application of application Ser. No. 15/785,447 filed on Oct. 17, 2017, and included herein by reference.

BACKGROUND OF THE INVENTION

1. Field of the Invention

The present invention is related to an integrated circuit with a standard cell, and more particularly, to an integrated circuit with an inverter standard cell or with an NAND standard cell.

2. Description of the Prior Art

Standard cells are composed of a set or a plurality of transistors which are connected to each other, being used to execute Boolean logic functions (such as AND, OR, XOR or XNOR) or can provide storage functions (as a flip-flop or a latch). With the advanced process technology, such as Fin-FET transistor, the layout design of the standard cells can be various.

The standard cell library provides the fundamental datum used to support the automation process for fabricating integrated circuits, as it can construct the entire integrated circuits automation process, from the front end simulation to the rear end layout implementation. Standard cell library includes a plurality of pre-designed standard cells, each containing a circuit layout pattern, the contours, the values of performance, the power dissipation, the time sequence, and the capability of the device, or other electrical performance values. Since the standard cell contains a common interface to achieve a regular structure, integrated circuit designers can conveniently select the standard cell from the library, and in accordance with the design requirements, to design the layout of the integrated circuits. The formation of the integrated circuit based on the standard cell library can greatly upgrade the design efficiency.

SUMMARY OF THE INVENTION

The present invention therefore provides an integrated circuit with a standard cell to give a useful tool for the integrated circuit designers.

According to one embodiment, the present invention provides an integrated circuit with an inverter standard cell. The integrated circuits include a first metal line, a second metal line, a set of first dummy gates, a set of second dummy gates, a plurality of fin structures, a gate structure, two short contact plugs, two long contact plugs, a gate contact plug, a plurality of via plugs and a metal layer. The first metal line and a second metal line extend along a first direction. The set of first dummy gates and the set of second dummy gates extend along a second direction, wherein a region encompassed by the first metal line, the second metal line, the set of first dummy gates and the set of second dummy gates is defined as a standard cell region, and the standard cell region has an N-type region and a P-type region. The plurality of fin structures are disposed in the standard cell region, wherein the fin structures are parallel to the first direction. The gate structure is disposed in the standard cell region and is on the fin structures and parallel to the second direction. The short contact plugs and the long contact plugs are disposed in the standard cell region, wherein the long contact plugs are disposed at a side of the gate structure and the short contact plugs are disposed at the other side of the gate structure. The gate contact plug is disposed on the gate structure. The plurality of via plugs are disposed on and electrically connected to the long contact plugs, the short contact plugs and the gate contact plug. The metal layer is disposed on and electrically connected to the via plugs, wherein the metal layer comprises the first metal line, the second metal line, a third metal line and a fourth metal line.

According to another embodiment, the present invention provides an integrated circuit with an inverter standard cell. The integrated circuits include a first metal line, a second metal line, a set of first dummy gates, a set of second dummy gates, a plurality of fin structures, two gate structure, three short contact plugs, three long contact plugs, two gate contact plugs, a plurality of via plugs and a metal layer. The first metal line and the second metal line extend along a first direction. The set of first dummy gates and the set of second dummy gates extend along a second direction, wherein a region encompassed by the first metal line, the second metal line, the set of first dummy gates and the set of second dummy gates is defined as a standard cell region, and the standard cell region has an N-type region and a P-type region. The plurality of fin structures are disposed in the standard cell region, wherein the fin structures are parallel to the first direction. The two gate structures are disposed in the standard cell region, on the fin structures and parallel to the second direction. The three short contact plugs and three long contact plugs are disposed in the standard cell region, wherein the two long contact plugs are disposed between one of the gate structures and the set of the first dummy gates, two of the short contact plugs are disposed between the two gate structures, and one of the long contact plugs and one of the short contact plugs are disposed between the other gate structure and the set of second dummy gates. The two gate contact plugs are disposed on the two gate structures. The plurality of via plugs are disposed on and electrically connected to the long contact plugs, the short contact plugs and the gate contact plugs. The metal layer is disposed on and electrically connected to the via plugs, wherein the metal layer comprises the first metal line, the second metal line, a third metal line, a fourth metal line and a fifth metal line.

The integrated circuits with standard cells are provided by the present invention, in which one embodiment refers to an inverter standard cell and the other embodiment refers to an NAND standard cell. By incorporating the above standard cells, logical circuits that can execute any logical operation can be approached simply, so the performance of the device can be upgraded.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
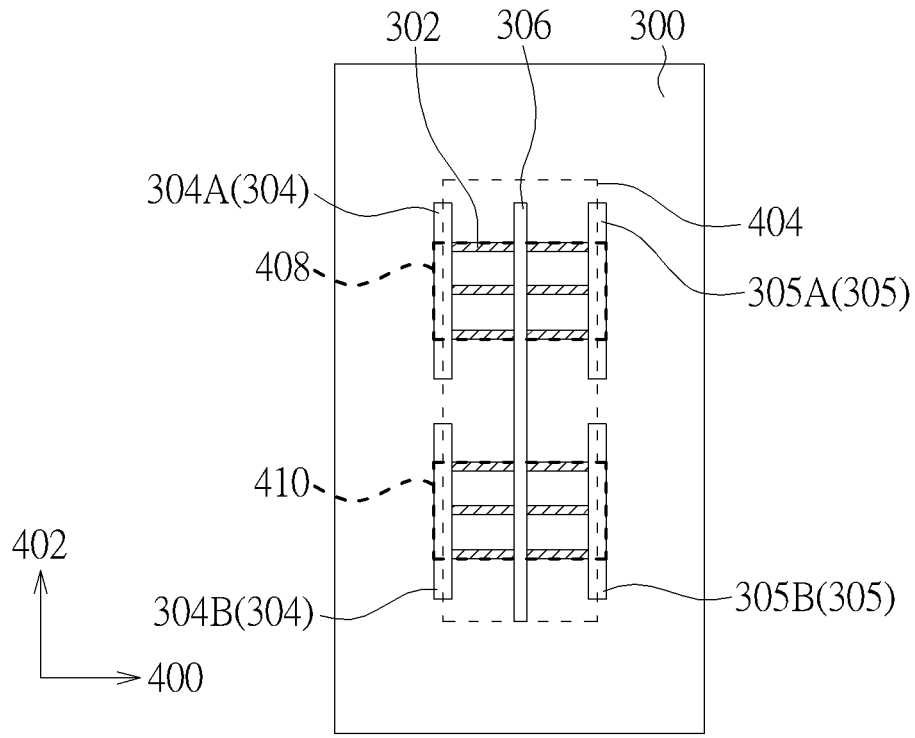
FIG. 1 to FIG. 3 are schematic diagrams of the integrated circuits with an inverter standard cell.
Figure 2:
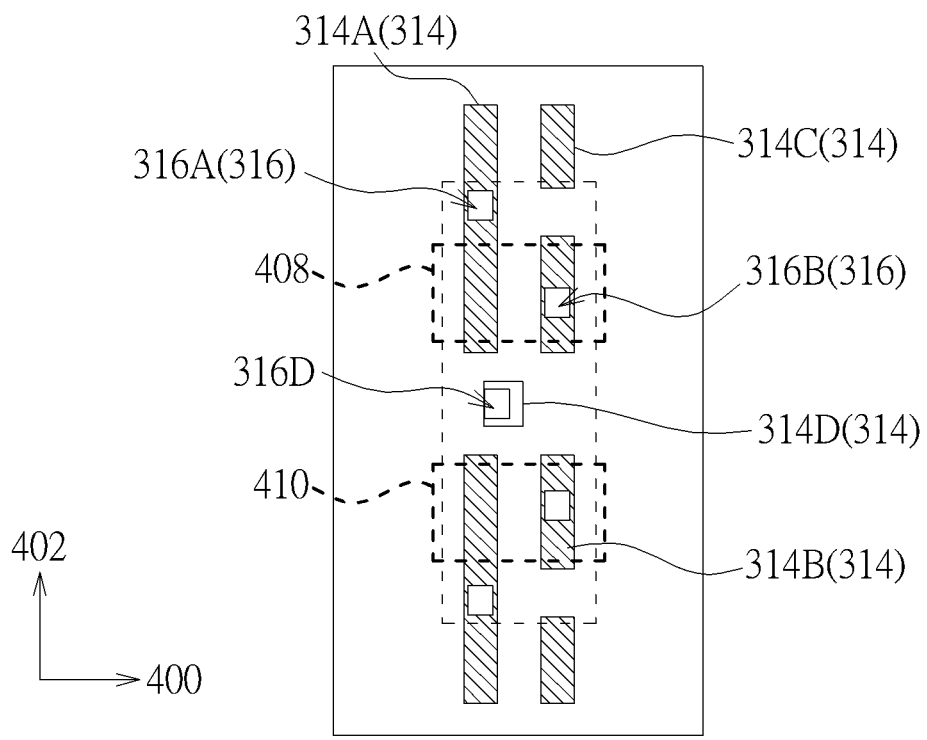
Figure 3:
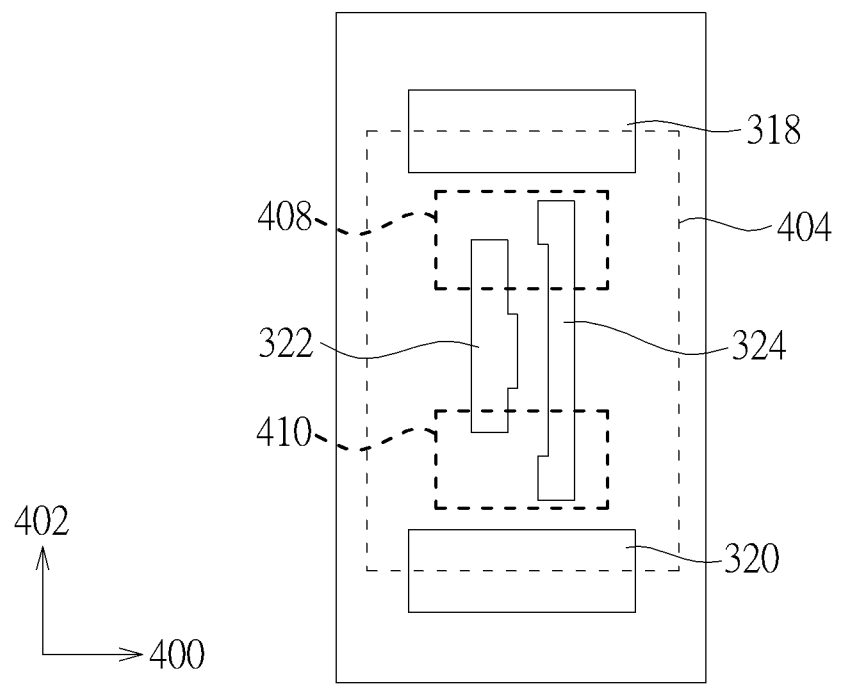

Please refer to FIG. 1 to FIG. 3, which show schematic diagrams of the integrated circuits with an inverter standard cell. The integrated circuits include fin structures, dummy gates, gate structure, contact plugs, via plugs and metal lines. In order to correctly point out the relative vertical positions of each components, the components of the inverter standard cells are split into three parts and are presented from bottom to top in FIG. 1, FIG. 2 and FIG. 3. Please see FIG. 1 first. The inverter standard cell is disposed on a substrate 300. The substrate 300 can include a semiconductor material, such as a silicon substrate, an epitaxial silicon substrate, a silicon germanium substrate, a silicon carbide substrate, a single crystal silicon substrate, a single crystal silicon germanium substrate, an amorphous silicon substrate, or a silicon on insulator (SOI), but it is not limited thereto. The substrate 300 has a standard cell region 404 with rectangular shape in this embodiment, in which a short side is parallel to the first direction 400, and the long side is parallel to a second direction 402. The standard cell region 404 has a P-type region 408 and an N-type region 410, respectively located at the upper side and the lower side of the standard cell region 404. In one embodiment, the projections of the P-type region 408 and the N-type region 410 along the first direction 400 are slightly larger than the projection of standard cell region 404 along the first direction 400. In another embodiment, the projections of the P-type regions 408 and the N-type region 410 along the first direction 400 can completely coincide the projection of standard cell region 404 along the first direction 400

As shown in FIG. 1, the inverter standard cell of the present embodiment further include a plurality of fin structures 302, which are disposed on the substrate 300 and are extending along the first direction 400, being located in the P-type region 408 and N-type region 410. In one embodiment, there is N number of fin structures 302 located in the P-type region 408 and M number of fin structures located in the N-type region 410, wherein M and N are preferably odd numbers and N is greater than or equal to M. In the present embodiment, M and N are both 3. In one embodiment invention, the fin structures 302 are evenly arranged in the standard cell region 404, and there are four fin structures 302 located respectively at the edges of the N-type regions 408 and P-type region 410 that are parallel to the first direction 400. The fin structures in the P-type region 408 have P type dopants such as boron (B), aluminum (Al) or gallium (Ga), and the fin structures located in the N-type region 410 have N type dopants such as phosphorus (P), arsenic (as) or antimony (Sb), but are not limited thereto. A set of first dummy gates 304, a set of second dummy gates 305 and a gate structure 306 are disposed on the fin structures 302, all of which extend along a second direction 402, wherein the first dummy gates 304, the second dummy gates 305 are disposed corresponding to the long side of the standard cell region 404, while the gate structures 306 are disposed between the first dummy gates 304 and the second dummy gates 305. In one embodiment, the set of first dummy gates 304 include two first dummy gates 304A, 304B which are separated and do not contact each other, wherein the first dummy gate 304A extends across the P-type region 408, and the first dummy gate 304B extends across the N-type region 410. The set of second dummy gates 305 include two second dummy gates 305A, 305B which are separated and do not contact each other, wherein the second dummy gate 304A extends across the P-type region 408, and the second dummy gate 304B extends across the N-type region 410. The gate structure 306 located between the first dummy gates 304 and the second dummy gates 305 extend both across the P-type region 408 and the N-type region 410 and across M+N number of the fin structures 302. Thus, plural P-type transistors are formed in the P-type region 408, and plural N-type transistors 410 are formed in the N-type region 410. In one embodiment, the first dummy gates, the second dummy gates 305 and the gate structure 306 can be formed simultaneously through a same fabrication processes, for example, by a conventional poly-silicon process, or an advanced metal gate process, so the cross section of the gates may include gate dielectrics (not shown) and metal layers (not shown).

Please refer to FIG. 2. A plurality of contact plugs (also called "slot contacts") are disposed over the fin structures 302, the first dummy gates 304, the second dummy gates 305 and the gate structure 306 to form the external electrical connections. The contact plugs 314 include: two long contact plugs 314A, two short contact plugs 314B, two dummy contact plugs 314C and a gate contact plug 314D. It is understood that the layout of the digital circuit is composed of various standard cell regions 404. The dummy contact plugs 314C will not be located in the standard cell region 404 of the digital circuits, instead, the dummy contact plugs 314C will be only appeared in the peripheral region of the digital circuits. Please refer to both FIG. 1 and FIG. 2. In the standard cell area 404, the two long contact plugs 314A are located between the first dummy gates 304 and gate structure 306, and the projections of the two long contact plugs 314A along the first direction 400 completely coincide with each other (i.e. they are at the same line), and from the view of the second direction 402, one of the long contact plugs 304A extends across the P-type region 408 and further extends upwardly to outsides of the standard cell region 404, thus straddling over the fin structures 302 in the P type region 408; the other one of the long contact plugs 304A extends across the N-type region 410 and further extends downwardly to outsides of the standard cell region 404, thus straddling over the fin structures 302 in the N type region 410. In the standard cell region 404, the two short contact plugs 314B are located between the second dummy gates 304 and gate structure 306, and the projections of the two short contact plugs 314B along the first direction 400 completely coincide with each other (i.e. they are at the same line), and from the view of the second direction 402, one of the short contact plugs 304B extends across the P-type region 408 and straddles over the fin structures 302 in the P type region 408; the other one of the short contact plugs 304B extends across the N-type region 410 and straddles over the fin structures 302 in the N type region 410. In one preferred embodiment of the present invention, in the standard cell region 404, the long contact plugs 314A and the short contact plugs 314B can be formed through one or more than one photo-etching-process (PEP) by using two or more than two mask layers. For example, a first patterned mask layer (not shown) with a plurality of trenches having the same size as the long contact plugs 314A is formed, then a second patterned mask layer (not shown) is formed to fill into partials of the trenches, separating the trenches and thus forming the short contact plugs 314B. The gate contact plug 314D is located at the middle of the standard cell region 404 and is electrically connected to the gate structure 306. In one embodiment, the holes of the gate contact plug 314D, the long contact plugs 314A, the short contact plugs 314B and the dummy contact plugs 314C can be fabricated by different process, but they can be filled with the same metal layer and then polished, so as to be formed simultaneously. Thus, the gate contact plug 314D, the long contact plugs 314A, the short contact plugs 314B and the dummy contact plugs 314C have the same height of the top surface. Subsequently, a plurality of via plugs 316 are formed on the long contact plugs 314A, the short contact plugs 314B and the gate contact plug 314D, respectively. The via plugs 316 include: two long via plugs 316A corresponding to the long contact plugs 314A, two short via plugs 316B correspond to the short contact plugs 314B, and one gate via plug 316D corresponding to the gate contact plug 314D.

As shown in FIG. 3, in the standard cell region 404, the plurality of via plugs 316 connect upwardly to a first metal line 318, a second metal line 320, a third metal line 322 and a fourth metal line 324. The first metal line 318 and the second metal line 320 extend parallel to the second direction 402, and a central line of the first metal line 318 corresponds to the short edge of the standard cell edge region 404, a central line of the second metal line 320 corresponds to the other short edge of the standard cell region 404. The third metal line 322 and the fourth metal line 324 are disposed at the middle of the standard cell region 404. The first metal line 318 connects to one of the long via plugs 316A, the second metal line 320 connects to the other long via plug 316A, the third metal line 322 connects to the gate via plug 316B and the fourth metal line 324 connects to the two short via plugs 316C. When the first metal line 318 is applied to $V_{DD}$, the second metal line 320 is applied to $V_{SS}$, the third metal line 322 is applied to $V_A$ and the fourth metal line 324 is applied to $V_B$, the P-type transistors in the P-type region 408 and the N-type transistors in the N-type region 410 can therefore form an inverter circuit. Thus, the components of the standard cell region 404 (defined by the first metal line 318, the second metal line 320, the first dummy gates 304, the second dummy gates 305) represents an inverter standard cell and can be arranged arbitrarily with other standard cells to form various integrated circuits, and the components outside the standard cells can also be adjusted arbitrarily according to the design of the circuits.

Figure 4:
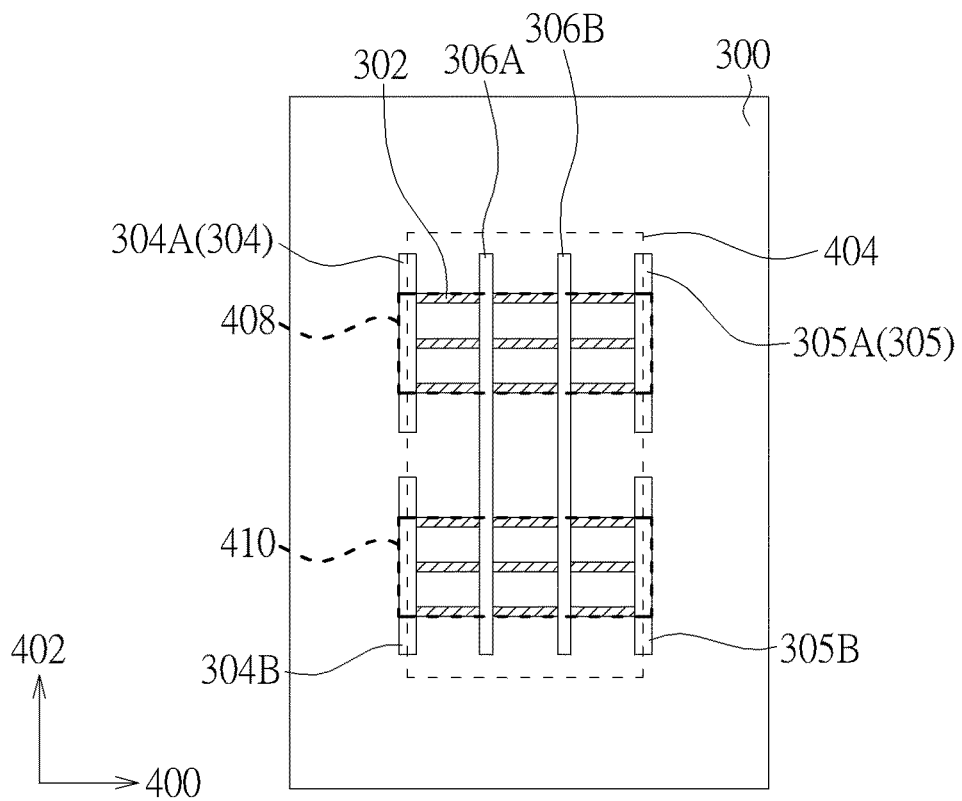
FIG. 4 to FIG. 6 are schematic diagrams of the integrated circuits with an NAND standard cell.
Figure 5:
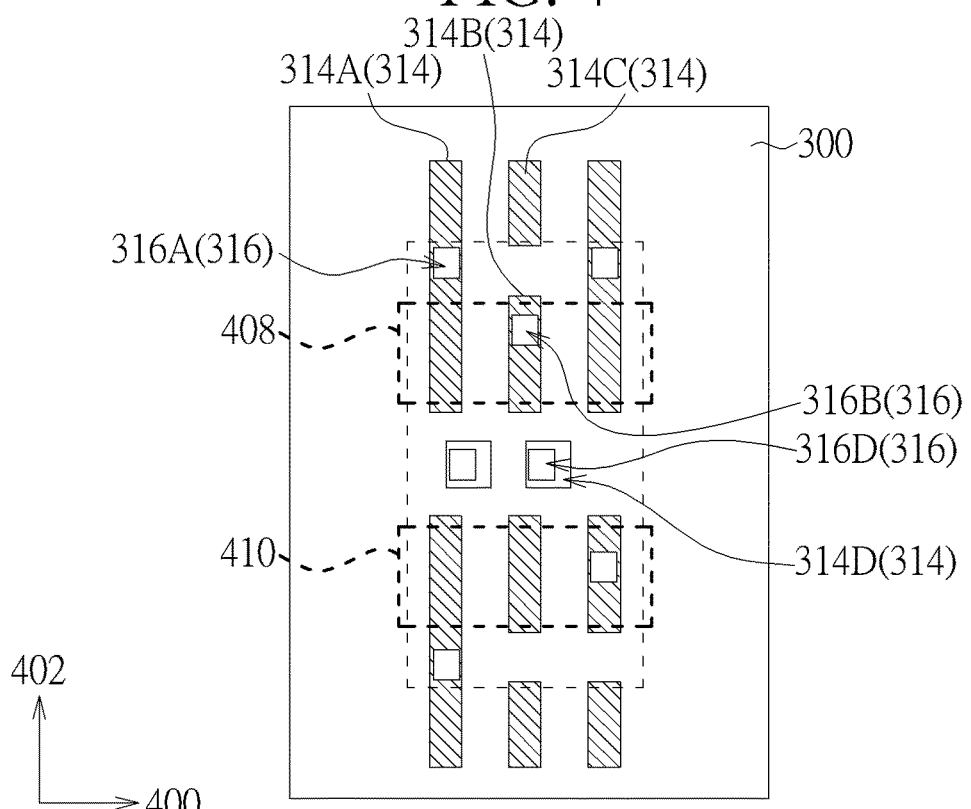
Figure 6:
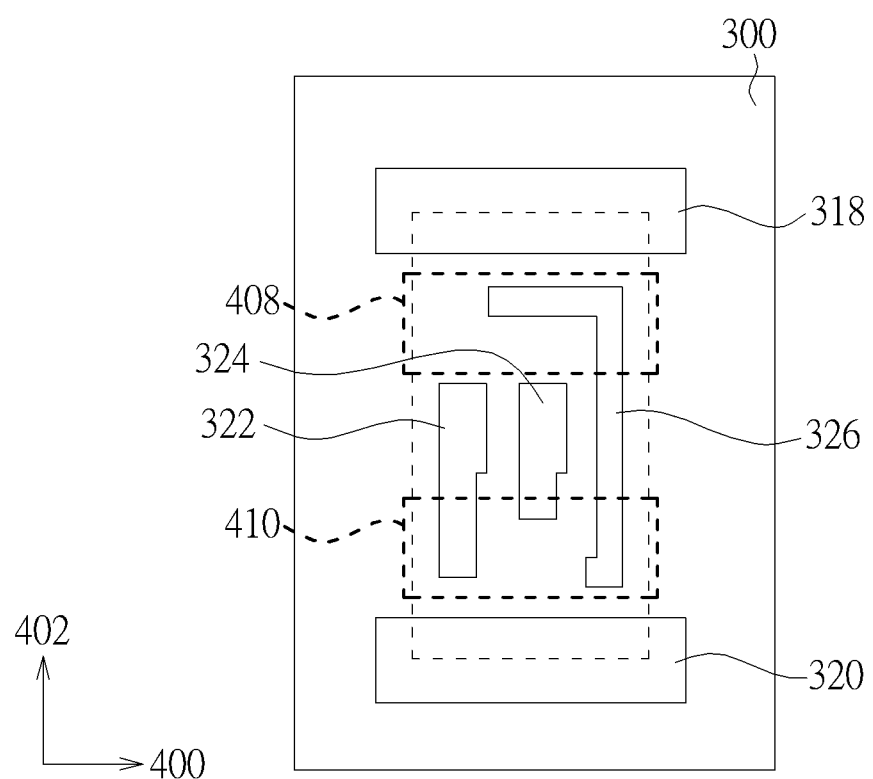

Please refer to FIG. 4 to FIG. 6, which show schematic diagrams of the integrated circuits with a standard cell according to one embodiment of the present invention, in which the present embodiment shows an NAND standard cell. The integrated circuits include fin structures, dummy gates, gate structure, contact plugs, via plugs and metal lines. Similarly, the components of the NAND standard cells are split into three parts and are presented from bottom to top in FIG. 4, FIG. 5 to FIG. 6. Please see FIG. 4 first. The substrate 300 has a standard cell region 404 with a P-type region 408 and an N-type region 410. In one embodiment, the projections of the P-type regions 408 and the N-type region 410 along the first direction 400 are slightly larger than the projection of standard cell region 404. A plurality of fin structures 302 are disposed on the substrate 300 and are extending along the first direction 400, being located both in the P-type region 408 and N-type region 410. A set of first dummy gates 304, a set of second dummy gates 305, a first gate structure 306A and a second gate structure 306B are disposed on the fin structures 302, all of which extend along a second direction 402. The first dummy gates 304 and the second dummy gates 305 are disposed at two sides of the standard cell region 404, and the first gate structure 306A and the second gate structure 306B are disposed between the first dummy gates 304 and the second dummy gates 305, wherein the first gate structure 306A is disposed adjacent to the first dummy gates 304 and the second gate structure 306B is disposed adjacent to the second dummy gates 305.

The detail embodiments of the substrate 300, the standard cell region 404, the P-type region 408, the N-type region 410, the fin structures 302, the first dummy gates 304, the second dummy gates 305, the first gate structure 306A and the second gate structure 306B are similar to the previous embodiment and are omit for the sake of simplicity.

Please refer to FIG. 5. A plurality of contact plugs are disposed over the fin structures 302, the first dummy gates 304, the second dummy gates 305, the first gate structure 306A and the second gate structure 306B. The contact plugs 314 include: three long contact plugs 314A, three short contact plugs 314B, three dummy contact plugs 314C and two gate contact plugs 314D. It is understood that the layout of the digital circuit is composed of various standard cell regions 404. The dummy contact plugs 314C will not be located in the standard cell region 404 of the digital circuits, instead, the dummy contact plugs 314C will be only appeared in the peripheral region of the digital circuits. In the standard cell area 404, two of the long contact plugs 314A are located between the first dummy gates 304 and first gate structure 306A, and the projections of the two long contact plugs 314A along the first direction 400 completely coincide with each other; two of the short contact plugs 314B are located between the first gate structure 306A and the second gate structure 306B, and the projections of the two short contact plugs 314B along the first direction 400 completely coincide with each other; one of the long contact plugs 314A and one of the short contact plugs 314B are located between the second dummy gates 305 and second gate structure 306B, and the projections of said long contact plug 314A and the said short contact plug 314B along the first direction 400 completely coincide with each other. The plurality of via plugs 316 include: three long via plugs 316A corresponding to the long contact plugs 314A, two short via plugs 316B correspond to the short contact plugs 314B, and two gate via plug 316D corresponding to the gate contact plug 314D. It is noted that only the short contact plug 314B in the P-type region 408 is connected to the short via plugs 316B while the short contact plug 314B in the N-type region 410 is not connected to any short via plugs 316B. The detail embodiments of the contact plugs 314 and the via plugs 316 are similar to the previous embodiment and are omit for the sake of simplicity.

As shown in FIG. 6, a first metal line 318, a second metal line 320, a third metal line 322 and a fourth metal line 324 are disposed on the via plugs 316. The first metal line 318 connects to two of the long contact plugs 316A, the second metal line 320 connects to the other one of the long via plug 316A, the third metal line 322 connects to one of the gate via plugs 316B, the fourth metal line 324 connects to the other one of the gate via plugs, and the fifth metal line 326 connects the two short via plugs 316C. When the first metal line is applied to $V_{DD}$, the second metal line is applied to $V_{SS}$, the third metal line is applied to $V_A$, the fourth metal line is applied to $V_B$, and the fifth metal line is applied to $V_Z$, the P-type transistors in the P-type region 408 and the N-type transistors in the N-type region 410 can therefore form an NAND circuit.

In summary, the present invention provides an integrated circuit with standard cells, in which one embodiment refers to an inverter standard cell and the other embodiment refers to an NAND standard cell. By incorporating the above standard cells, logical circuits that can execute any logical operation can be approached simply, so the performance of the device can be upgraded.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit with a standard cell, comprising:
a first metal line and a second metal line, extending along a first direction;
a set of first dummy gates and a set of second dummy gates, extending along a second direction, wherein a region encompassed by the first metal line, the second metal line, the set of first dummy gates and the set of second dummy gates is defined as a standard cell region, and the standard cell region has an N-type region and a P-type region;
a plurality of fin structures disposed in the standard cell region, wherein the fin structures are parallel to the first direction;
two gate structures disposed in the standard cell region, being on the fin structures and parallel to the second direction;
three short contact plugs and three long contact plugs disposed in the standard cell region, wherein two of the long contact plugs are disposed between one of the gate structures and the set of first dummy gates, two of the short contact plugs are disposed between the two gate structures, and one of the long contact plugs and one of the short contact plugs are disposed between the other gate structure and the set of second dummy gates;
two gate contact plugs disposed on the two gate structures;
a plurality of via plugs disposed on and electrically connected to the long contact plugs, the short contact plugs and the gate contact plugs; and
a metal layer disposed on and electrically connected to the via plugs, wherein the metal layer comprises the first metal line, the second metal line, a third metal line, a fourth metal line and a fifth metal line.

2. The integrated circuit according to claim 1, wherein the set of first dummy gates comprise two first dummy gates which do not contact each other, and the set of second dummy gates comprise two second dummy gates which do not contact each other.

3. The integrated circuit according to claim 1, wherein an N number of fin structures are disposed in the P-type region and an M number of fin structures are disposed in the N-type region, N and M are odd numbers and N is greater than or equal to M.

4. The integrated circuit according to claim 1, wherein projections along the first direction from the two long contact plugs between the gate structure and the set of first dummy gates completely coincide to each other.

5. The integrated circuit according to claim 1, wherein projections along the first direction from the two short contact plugs between the two gate structures completely coincide to each other.

6. The integrated circuit according to claim 1, wherein projections along the first direction from one of the long contact plugs and one of the short contact plugs between the gate structure and the set of second dummy gate completely coincide to each other.

7. The integrated circuit according to claim 1, wherein the three long contact plugs further extend to outside of the standard cell region.

8. The integrated circuit according to claim 1, wherein the via plugs comprise two short via plugs, three long via plugs and two gate via plugs.

9. The integrated circuit according to claim 8, wherein the first metal line connects two of the long contact plugs, the second metal line connects the other one of the long contact plugs.

10. The integrated circuit according to claim 8, wherein the third metal line connects one of the gate via plugs, the fourth metal line connects the other one of the gate via plugs, and the fifth metal line connects the two short via plugs.

* * * * *